(12) United States Patent
Rueppel et al.

(10) Patent No.: US 10,672,250 B2
(45) Date of Patent: Jun. 2, 2020

(54) METHOD FOR ASCERTAINING A STATE OF A PRODUCT

(71) Applicant: Robert Bosch GmbH, Stuttgart (DE)

(72) Inventors: Wolfgang Rueppel, Frammersbach (DE); Adrien Mouaffo Tiadjio, Neu-Ulm (DE); Christoph Maier, Kleinostheim (DE); Jochen Mueller, Backnang (DE); Patric Brand, Sennfeld (DE); Peter Rehbein, Erlabrunn (DE); Roman Ritter, Stuttgart (DE); Sebastian Vornwald, Wuerzburg (DE); Thomas Inderwies, Frammersbach (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/194,431

(22) Filed: Nov. 19, 2018

(65) Prior Publication Data
US 2019/0156648 A1 May 23, 2019

(30) Foreign Application Priority Data

Nov. 20, 2017 (DE) ........................ 10 2017 220 704

(51) Int. Cl.
| G08B 21/18 | (2006.01) |
| G01K 1/02 | (2006.01) |
| G01J 1/42 | (2006.01) |
| G01K 13/08 | (2006.01) |
| G01P 15/097 | (2006.01) |
| G01P 15/16 | (2013.01) |
| G01R 33/02 | (2006.01) |

(52) U.S. Cl.
CPC ............... *G08B 21/182* (2013.01); *G01J 1/42* (2013.01); *G01K 1/024* (2013.01); *G01K 13/08* (2013.01); *G01P 15/097* (2013.01); *G01P 15/16* (2013.01); *G01R 33/02* (2013.01); *G01K 2205/00* (2013.01); *G01K 2205/02* (2013.01); *G01K 2205/04* (2013.01)

(58) Field of Classification Search
CPC ......... G08B 21/182; G01J 1/42; G01K 13/08; G01P 15/097; G01P 15/16; G01R 33/02
USPC ....................................................... 340/540
See application file for complete search history.

(56) References Cited

U.S. PATENT DOCUMENTS

| 2009/0216410 A1* | 8/2009 | Allen ................... G05D 1/0238 701/50 |
| 2011/0193710 A1* | 8/2011 | McIlvain ................. B60P 3/20 340/585 |
| 2015/0112542 A1* | 4/2015 | Fuglewicz ........... G07C 5/0858 701/32.2 |
| 2015/0149026 A1* | 5/2015 | Oswald ................... B66C 13/18 701/29.3 |

(Continued)

Primary Examiner — Kerri L McNally
(74) Attorney, Agent, or Firm — Maginot, Moore & Beck LLP

(57) ABSTRACT

A method ascertains a state of a product in a plurality of time periods using a detection unit associated with the product. The method including the following for each of the time periods: setting a configuration of the detection unit at a beginning of the respective time period, the configuration different than a configuration available beforehand, and detecting at least one measured value using the detection unit in the respective time period on the basis of the set configuration.

12 Claims, 2 Drawing Sheets

(56) References Cited

U.S. PATENT DOCUMENTS

2016/0260059 A1\* 9/2016 Benjamin .......... G06Q 10/0832
2017/0108261 A1\* 4/2017 Broussard ............. F25D 11/003

\* cited by examiner

METHOD FOR ASCERTAINING A STATE OF A PRODUCT

This application claims priority under 35 U.S.C. § 119 to patent application no. DE 10 2017 220 704.3, filed on Nov. 20, 2017 in Germany, the disclosure of which is incorporated herein by reference in its entirety.

The disclosure relates to a method for ascertaining a state of a product, in particular in a plurality of time periods and using a detection unit associated with the product.

BACKGROUND

It is known practice to ascertain the state of products using sensors. This regularly involves the use of electronic subassemblies having very limited functionality. A determined electronic subassembly of this kind can be used to ascertain the state of a product as desired only in one particular life cycle. When a product enters a new life cycle, it may be necessary to replace the electronic subassembly.

SUMMARY

Against this background, it is an object of the disclosure here to solve or at least reduce the technical problems outlined in connection with the prior art. A particular aim is to present a method for ascertaining a state of a product that can be used to ascertain the state of the product particularly flexibly.

This object is achieved by means of a method for ascertaining a state of a product as described herein. Further advantageous configurations of the method are specified in the dependent patent claims. The features individually included in the patent claims are combinable with one another in any manner that makes technological sense, and can be complemented by explanatory substantive matter from the description, further variant embodiments of the disclosure being demonstrated.

A method for ascertaining a state of a product in particular in a plurality of time periods (life cycles) using a detection unit associated with the product is presented. The method comprises at least the following respective method steps for each of the time periods:

a) setting a configuration of the detection unit at the beginning of the respective time period, the configuration being different than a configuration available beforehand, and b) detecting at least one measured value using the detection unit in the respective time period on the basis of the configuration set according to step a).

As a result of altered settings, the product can accomplish multiple tasks in the product life cycle. Depending on the stage of the product life cycle that the product is in, it can perform different tasks. In order to be able to detect the state of the product in the various stages particularly efficiently, the configuration of the detection unit (that is to say in particular of a microprocessor of the detection unit, in particular with regard to parameters of the detection and the evaluation thereof) is set preferably on the basis of the respective stage of the product life cycle. This can be effected in particular by means of "firmware over the air".

The product may in particular be a component of a machine tool, of a production machine, of a vehicle or of an industrial installation, for example. In particular, the product may be a valve, an actuator, a motor or a passive structure, such as, for example, a supporting structure. The method described is not restricted to the cited products, however.

The method described can be used to ascertain the state of the product. The state of the product preferably comprises at least one measured value. Possibilities in this regard are in particular measured values for such variables as can be used to describe a property of the product, in particular a property of the product that varies over time.

The at least one measured value can be recorded in particular using the detection unit. The detection unit may in particular be an embedded system. This means in particular that the detection unit may be intended and set up to record one or more measured variables. The detection unit can be referred to as a sensor subassembly. Preferably, the detection unit is of autonomous design, that is to say can be operated without a cable connection. To that end, the detection unit preferably has at least one battery.

The detection unit being associated with the product means in particular that the detection unit can be used to record measured values suitable for describing the state of the product. These may in particular be measured values recorded directly in the area of the product. As such, it is preferred for the detection unit to be attached to the product. By way of example, the detection unit may be adhesively bonded to a packaging or to a surface of the product.

Different aspects of the state of the product may be of particular interest at different times. In the case of products usable for different applications, different measured values can thus describe the state of the product depending on the application, for example. The method described can be used to ascertain the state of a product in different situations using the same detection unit.

To that end, the state of the product is ascertained in a plurality of time periods using the method described. In each of the time periods, the product may be in a respective situation or at a respective stage of the product life cycle. By way of example, the product can be operated in different modes of operation in the different time periods. Therefore, different demands on the ascertainment of the state of the product can arise in the different time periods.

Preferably, a total period over which the method is performed is divided into the plurality of time periods. That means that the time periods do not overlap one another and that there is no interval of time between two adjacent time periods. Each time in the total period over which the method is performed is thus associated with precisely one of the time periods. Alternatively, however, it is in particular also possible for there to be an interval of time between two adjacent time periods.

The method described comprises the respective steps a) and b) for each of the time periods. The method described can be performed cyclically to that extent. Steps a) and b) alternate. The respective steps a) and b) are performed for each of the time periods.

In step a), a configuration of the detection unit is set at the beginning of the respective time period. The configuration thus set is different than a configuration available beforehand.

Step a) marks the beginning of the respective time period. In this instance, the detection unit is configured on the basis of the demands of the respective time period. As such, it is in particular possible to set which measured values are meant to be recorded at which times in the respective time period. By way of example, it is also possible to set whether, when and to what extent the recorded measured values are meant to be processed further, stored and/or transmitted from the detection unit to external devices.

The configuration set in step a) being different than a configuration available beforehand means that a different configuration existed in a time period immediately preceding the current time period. Step a) thus involves the configuration being changed, which can also be referred to as reconfiguration. It is not impossible, however, for a configuration, once set, to be set again in a later time period. As such, by way of example, a first configuration can be set in a first time period, a second configuration, which is different than the first configuration, can be set in a second time period and the first configuration can be set again in a third time period. At the beginning of all three time periods, a configuration is set here that, in the context used here, can be regarded as different than the configuration available beforehand.

Step a) is followed, for each of the time periods, by step b). This step involves at least one measured value being detected using the detection unit in the respective time period on the basis of the configuration set according to step a). Step b) can be regarded as execution of the configuration set according to step a).

In a preferred embodiment of the method, at least one of the time periods is a transport time period in which transport of the product is monitored, step b) of the transport time period involving at least one respective measured value being recorded for at least one of the following variables using the detection unit:
an acceleration,
a temperature.

Preferably, step b) of the transport time period involves at least one respective measured value being recorded at least for the acceleration and for the temperature using the detection unit.

The product is preferably transported in the transport time period. The transport time period may in particular be a first time period occurring at the beginning of the method. As such, the detection unit can be associated with the product after manufacture thereof, for example (in particular by attaching the detection unit to the product or to the packing thereof). Subsequently, the method described can be begun with step a) of the transport time period. It is also possible for the method described to also comprise time periods before the transport time period. This is in particular the case when the transport to be monitored is not an (initial) delivery, but rather a transport from a first place of use to a second place of use of the product, for example.

When the product is transported, it is in particular possible to monitor whether the product is damaged in transport. Such damage can arise in particular as a result of jolts and vibrations. As such, in particular sensitive products can be damaged by jolts. An acceleration sensor can be used according to the method described to detect whether, when and to what extent jolts or vibrations have occurred, for example. Products may also be sensitive to temperature. This is the case with perishable foodstuffs, electronic subassemblies and chemicals, for example.

The method described can in particular be used to detect whether, for how long and/or to what extent prescribable limit values for the measured variables are exceeded during transport.

In a further preferred embodiment of the method, measured values recorded according to step b) are stored in the detection unit during the transport time period and are read from the detection unit after the transport time period.

During transport, transmission of the recorded measured values from the detection unit to an external device may be hampered or even impossible. In particular, the product with the detection unit may be out of range of a corresponding receiver. Transmission of data may also be hampered or even impossible in particular in an aircraft, a vehicle or a train. It is therefore preferred for the detection unit to be operated autonomously at least during the transport time period and for recorded measured values to be stored in a memory of the detection unit. After the transport time period, the memory can be read. This may be directly after the end of the transport time period or subsequently. The memory can in particular also be read in a later time period that does not directly follow the transport time period.

The memory is read preferably together with step a) at the time period following the transport time period. As such, a smartphone or tablet, for example, can be used firstly to read the memory and secondly to configure the detection unit.

In a further preferred embodiment of the method, at least one of the time periods is a detection time period in which at least one predetermined event is detectable, the detection time period involving at least one measured value being recorded for at least the following variable using the detection unit:
a light intensity.

In particular events that occur rarely (e.g. no more than once) can be detected in the detection time period.

As such, by way of example, it is possible to detect that a switchgear cabinet inside which the detection unit is provided is being opened or that it is open. This can be effected by measuring the light intensity, because it is dark inside the closed switchgear cabinet. The predetermined event in that example is the opening of the switchgear cabinet. The predetermined event may be detectable in so far as the occurrence of the predetermined event is assumed or stipulated on the basis of a measured light intensity in a predetermined value range. If a minimum light intensity is exceeded, for example, the switchgear cabinet can be regarded as open.

A further possible predetermined event is the absence of an expected incidence of light. As such, by way of example, a light barrier that is, fundamentally, permanently switched on can fail, reducing the detected light intensity.

One possible predetermined event is that a user illuminates the detection unit using a flashlight, for example. This can be done to activate the detection unit and/or to alter a state of the detection unit, for example.

One specific event or multiple events may be predetermined. A decision is preferably taken in the detection time period regarding whether one of these predetermined events and/or (if multiple different events are predetermined) which of the predetermined events occurs.

In a further preferred embodiment of the method, measured values recorded according to step b) are stored in the detection unit during the detection time period and are read from the detection unit after the detection time period.

Transmission of the recorded measured values to an external device may also be hampered or even impossible during the detection time period. Therefore, it is preferred for the detection unit to be operated autonomously at least during the detection time period and for recorded measured values to be stored in a memory of the detection unit. After the detection time period, the memory can be read. This may be directly after the end of the detection time period or subsequently. The memory can in particular also be read in a later time period that does not immediately follow the detection time period.

The memory is preferably read together with step a) of the time period following the detection time period.

In a further preferred embodiment of the method, at least one of the time periods is an operating time period in which operation of the product is monitored, the operating time period involving at least one respective measured value being recorded for at least one of the following variables using the detection unit:

an acceleration,
a light intensity,
a temperature,
a magnetic flux density.

During the operating time period, the product is preferably operating. This can mean that an installation in which the product is installed is operating. The product can even perform an activity itself during operation. As such, operation of the product can in particular comprise moving components of the product being moved. This can be effected by a drive provided outside the product or by a drive of the product. By way of example, a valve can be opened and closed as the product. Such movement of moving components of the product can be detected in particular using an acceleration sensor. By measuring the acceleration, it is possible to ascertain the time at which a valve was operated, for example. Further, the product may be exposed to vibrations during operation. These can emanate from the product itself or can be transmitted to the product from an external source. Measurement of vibrations using an acceleration sensor allows in particular knowledge about wear and/or damage to the product to be obtained.

A light intensity can also change during operation of the product. Measurement of the light intensity allows ascertainment, in particular for a light-sensitive product, of whether said product is damaged in operation or whether there is the threat of damage. Light can also be emitted by the product during operation thereof. By way of example, it is thus possible to use the detection unit to detect whether, when and at what level a light source of the product emits light.

A temperature to which the product is exposed during operation allows a manner of operation of the product to be inferred. If the product is a motor, for example, a high measured temperature can indicate that the motor is switched on. An excessively high temperature can indicate the presence of a fault in the product and/or in the surroundings thereof.

The magnetic flux density can be used to detect an electromagnetic impulse, for example. Such an impulse can be emitted by the product and/or received thereby during operation, for example. An electromagnetic impulse from an external source can also result in damage to the product.

The product can in particular be operated in different modes of operation. Each mode of operation preferably has an associated respective operating time period. Determined instances of the respective cited variables are preferably measured in a respective prescribed manner in each operating time period. By way of example, an acceleration can be periodically measured at first intervals of time in a first operating time period, while a temperature is periodically measured at second intervals of time in a second operating time period, the first intervals of time and the second intervals of time being different than one another.

The method described can comprise a multiplicity of time periods. In this instance, each of the time periods may be a transport time period, a detection time period, an operating time period or a time period of another kind. That there may also be a time period of another kind means that the list including transport time period, detection time period and operating time period is not conclusive. There may in particular be multiple time periods of the same kind, specifically also in direct succession to one another. As such, a first transport time period can be followed by a second transport time period, for example. As both of these cases are a transport time period, these time periods should be regarded as being of the same kind in this instance. The first transport time period and the second transport time period are different than one another, however, for example in so far as measured values are recorded for different variables and/or at different times of the respective transport time period in the two transport time periods.

In a further preferred embodiment of the method, measured values recorded during the operating time period are transmitted to a data network using the detection unit.

In particular during operation of the product, transmission of the measured values from the detection unit to an external device may be possible. This may in particular be because the product remains at the same location during an operating time period (in particular in contrast to a transport time period). Therefore, it is a particularly simple matter to take precautions to receive the measured values from the detection unit on a permanent basis or at least at predetermined intervals of time. In the present embodiment, this is accomplished by using a data network to which the measured values recorded using the detection unit are transmitted. The data network can in particular have a radio interface for contactless communication with the detection unit and/or an interface for a cable connection to the detection unit. The measured values can be received from the data network and processed further. Preferably, the measured values are transmitted to the data network directly after recording by the detection unit. Alternatively, it is possible for the measured values to be buffer-stored and analyzed in the detection unit first of all and then to be transmitted to the data network. As such, there may be provision, by way of example, for the measured values to be transmitted to the data network at discrete transmission times. Discontinuous transmission of this kind allows energy in the detection unit to be saved.

The measured values can be transmitted to the data network in particular directly by means of a communication module of the detection unit. This involves data being transmitted from the communication module, for example by radio, Bluetooth®, WLAN, infrared and/or mobile radio, to the data network or to a receiver linked thereto. Alternatively, it is possible for the measured values to be transmitted to the data network indirectly, for example via a smartphone or tablet. As such, it is possible, by way of example, for data to be transmitted from the detection unit via the communication module of the detection unit to the smartphone or tablet and from the latter to the data network or to a receiver linked thereto.

As an alternative to the present embodiment, it is also possible for measured values recorded during the operating time period according to step b) to be stored in the detection unit and read from the detection unit after the operating time period.

In a further preferred embodiment of the method, step a) is in each case initiated by virtue of the detection unit using contactless communication to receive a configuration command from a configuration device.

The detection unit can in particular be configured for multiple applications and, depending on the present requirement, can be set by means of "firmware over the air", for example. As such, the user can use the configuration device to reconfigure the detection unit, for example. The configuration device may in particular be a mobile device such as, for example, a smartphone or tablet or a permanently installed gateway. In particular, the user can use the configuration device to stipulate the configuration of the detection unit and hence in particular also to stipulate when a time period begins and the previous time period thus ends.

The configuration command can be transmitted from the configuration device to the detection unit in particular by means of near field communication. The configuration command can be used in particular to load a piece of software on to the detection unit, which is installed on a microprocessor of the detection unit.

In a further preferred embodiment of the method, the product is an operating component of a work machine.

The method described is in particular intended and set up for monitoring industrial production installations. The installation may in particular be a machine used to manufacture products in partially or completely automated fashion. The installation may also be a work machine such as an excavator or a crane.

As a further aspect, a detection unit is presented that is intended and set up for use in the method described and that comprises at least one sensor, a microprocessor, a memory and a communication module.

The special advantages and configuration features described for the method are applicable and transferable to the detection unit, and vice versa.

As a further aspect, a configuration device is presented that is intended and set up for use in the method described.

The special advantages and configuration features described for the method and the detection unit are applicable and transferable to the configuration device.

As a further aspect, a data network is presented that is intended and set up for use in the method described.

The special advantages and configuration features described for the method and the detection unit are applicable and transferable to the data network.

The disclosure and the technical sphere are explained in more detail below on the basis of the figures. The figures show an exemplary embodiment, to which the disclosure is not limited, however. By way of clarification, it should be pointed out that the technical features illustrated in the figures can also be combined with features of other figures and/or of the description without the need for other technical features of a figure to be adopted. Where there is a technical need to combine manifestations of one technical feature with those of another, this is explicitly referred to or pointed out, which means that these features are otherwise freely combinable.

DETAILED DESCRIPTION

Figure 1:
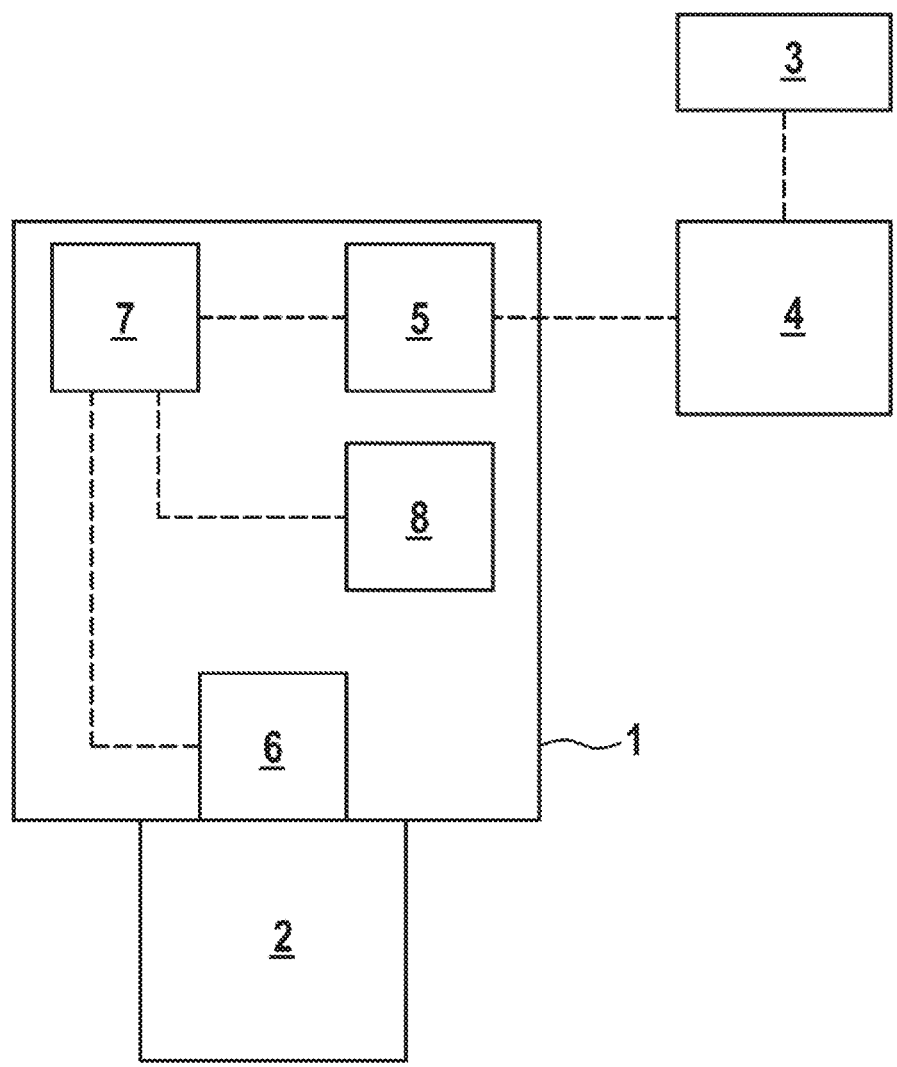
FIG. 1 schematically shows a depiction of a product with a detection unit, a configuration device and a data network, FIG. 2 schematically shows a depiction of a work machine on which several of the products shown in FIG. 1 are provided, and FIG. 3 schematically shows a depiction of a method for ascertaining a state of the product from FIG. 1.

FIG. 1 shows a product 2 to which a detection unit 1 for detecting a state of the product 2 is attached. The detection unit 1 comprises a sensor 6, a microprocessor 7, a memory 8 and a communication module 5. Additionally, the detection unit 1 can comprise a battery (not depicted). The communication module 5 connects the detection unit 1 to a configuration device 4. This communication may in particular be in the form of a near field communication or radio, Bluetooth®, WLAN, infrared via. The configuration device 4 is connected to a data network 3. This may in particular be realized by means of radio, WLAN, LAN and/or mobile radio.

Figure 2:
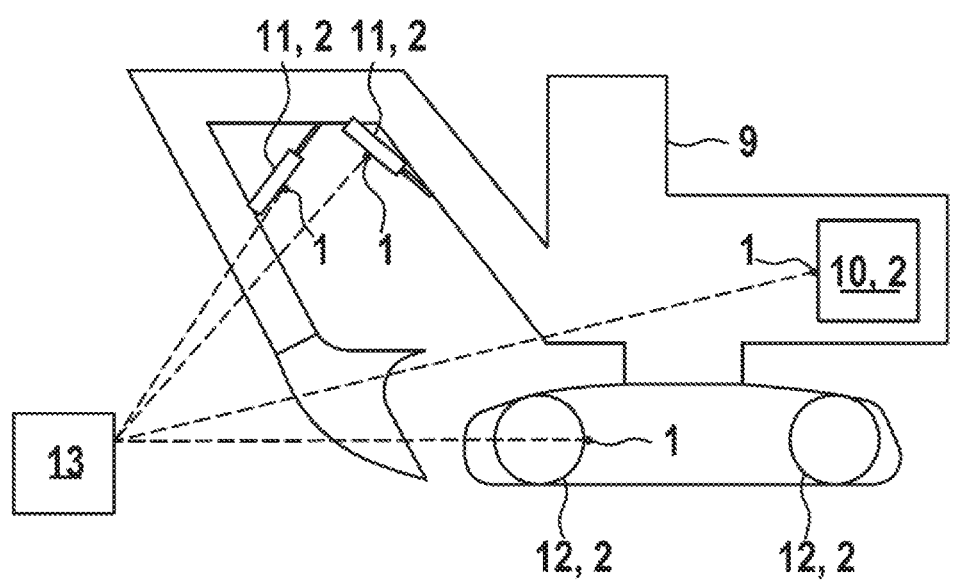

FIG. 2 shows a work machine 9. A motor 10, two hydraulic units 11 and a chain drive 12 each have a detection unit 1 according to the embodiment from FIG. 1 provided on them. The motor 10, the two hydraulic units 11 and the chain drive 12 are products 2 as in FIG. 1. The detection units 1 can be used to record measured values and transmit them to a receiver 13. The receiver 13 may in particular be linked to the data network 3 from FIG. 1. It is thus possible for a temperature of the motor 10 and vibrations of the chain drive 12 and the hydraulic units 11 to be measured, for example.

Figure 3:
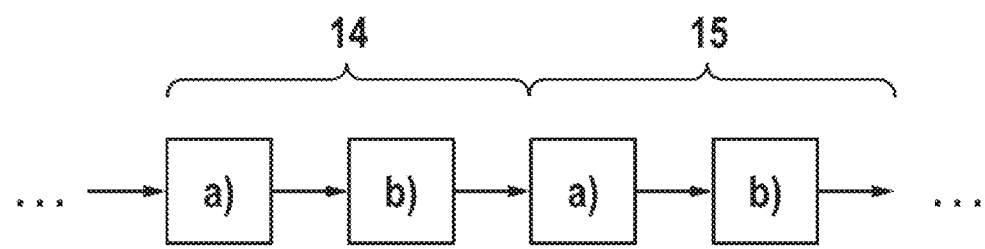

FIG. 3 shows a method for ascertaining a state of the product 2 from FIG. 1 in a plurality of time periods using the detection unit 1 associated with the product 2. By way of example, FIG. 3 shows a first time period 14 and a second time period 15. Dots indicate that there may be further time periods provided before the first time period 14 and after the second time period 15. For each of the time periods 14, 15 (and for all further time periods not shown), the method comprises at least the following respective method steps:

a) setting a configuration of the detection unit 1 at the beginning of the respective time period 14, 15, the configuration being different than a configuration available beforehand, and b) detecting at least one measured value using the detection unit 1 in the respective time period 14, 15 on the basis of the configuration set according to step a).

Depending on the time period 14, 15 and depending on the configuration, measured values are recorded for an acceleration, a light intensity, a temperature and/or a magnetic flux density. The measured values are stored in the memory 5 of the detection unit 1 and subsequently read from the detection unit 1 and/or transmitted to the data network 3.

Between the time periods 14, 15, the detection unit 1 is reconfigured.

After the detection unit 1 is fitted to the product 2, transport monitoring can be effected, for example. The sensors 6 of the detection unit 1 are in this instance configured such that extreme values result in an event being triggered and the data being stored in the memory 5 of the detection unit 1. After the product 2 has then arrived with the customer, the configuration of the detection unit 1 is altered by means of "firmware over the air" such that it records the relevant data during operation of the product 2. Further instances of these different configurations are programmable during the product life cycle of the product 2 and can be loaded at any time.

LIST OF REFERENCE SIGNS 1 detection unit
2 product
3 data network
4 configuration device
5 near field communication module
6 sensor
7 microprocessor
8 memory
9 work machine
10 motor
11 hydraulic unit
12 chain drive
13 receiver

What is claimed is:

1. A method for ascertaining a state of a product in a plurality of life cycles of the product using a detection unit associated with the product, comprising:
setting a configuration of the detection unit at a beginning of a respective life cycle of the plurality of life cycles, the set configuration defining at least one parameter used in detecting at least one measured value associated with the state of the product, the set configuration different than a configuration of the detection unit used during a previous life cycle; and
detecting the at least one measured value using the detection unit in the respective life cycle based on the set configuration.

2. The method according to claim 1, wherein:
the respective life cycle includes a transport time period in which transport of the product is monitored, and
the at least one measured value detected during the transport time period by the detection unit includes at least one of an acceleration and a temperature.

3. The method according to claim 2, further comprising:
storing the at least one measured value in the detection unit during the transport time period; and
reading the at least one measured value from the detection unit after the transport time period.

4. The method according to claim 1, wherein:
the respective life cycle includes a detection time period in which at least one predetermined event is detectable, and
the at least one measured value detected during the detection time period by the detection unit includes a light intensity.

5. The method according to claim 4, further comprising:
storing the at least one measured value in the detection unit during the detection time period; and
reading the at least one measured value from the detection unit after the detection time period.

6. The method according to claim 1, wherein:
the respective life cycle includes an operating time period in which operation of the product is monitored, and
the at least one measured value detected during the operating time period by the detection unit includes at least one of an acceleration, a light intensity, a temperature, and a magnetic flux density.

7. The method according to claim 6, wherein the at least one measured value detected during the operating time period is transmitted to a data network using the detection unit.

8. The method according to claim 1, wherein the configuration is set, in each case, by virtue of the detection unit using contactless communication to receive a configuration command from a configuration device.

9. The method according to claim 1, wherein the product is an operating component of a work machine.

10. A detection unit associated with a product, the detection unit comprising:
at least one sensor;
a communication module;
a memory; and
a microprocessor operatively connected to the at least one sensor, the communication module, and the memory, the microprocessor configured to ascertain a state of the product in a plurality of life cycles of the product by (i) setting a configuration of the detection unit at a beginning of a respective life cycle of the plurality of life cycles, the set configuration defining at least one parameter used in detecting at least one measured value associated with the state of the product, the set configuration different than a configuration of the detection unit used during a previous life cycle, and (ii) detecting the at least one measured value using the detection unit in the respective life cycle based on the set configuration.

11. The detection unit according to claim 10, wherein the detection unit is included in a configuration device.

12. The detection unit according to claim 10, further comprising:
a data network operably connected to the microprocessor,
wherein the respective life cycle includes an operating time period in which operation of the product is monitored,
wherein the at least one measured value detected during the operating time period by the detection unit includes at least one of an acceleration, a light intensity, a temperature, and a magnetic flux density, and
wherein the at least one measured value detected during the operating time period is transmitted to a data network using the communication module.

* * * * *